(12) United States Patent
Xiaochun et al.

(10) Patent No.: US 7,960,209 B2
(45) Date of Patent: Jun. 14, 2011

(54) SEMICONDUCTOR DEVICE ASSEMBLY PROCESS

(75) Inventors: Tan Xiaochun, Shanghai (CN); Jiang Xiaolan, Shanghai (CN)

(73) Assignee: Diodes, Inc., Westlake Village, CA (US)

( * ) Notice: Subject to any disclaimer, the term of this patent is extended or adjusted under 35 U.S.C. 154(b) by 0 days.

(21) Appl. No.: 11/047,804

(22) Filed: Jan. 31, 2005

(65) Prior Publication Data

US 2005/0189658 A1    Sep. 1, 2005

Related U.S. Application Data

(60) Provisional application No. 60/540,185, filed on Jan. 29, 2004.

(51) Int. Cl.
*H01L 21/44* (2006.01)

(52) U.S. Cl. . 438/107; 438/110; 257/676; 257/E21.499; 257/E23.001

(58) Field of Classification Search .......... 438/106–110; 257/678, 700, 778, 676
See application file for complete search history.

(56) References Cited

U.S. PATENT DOCUMENTS

| | | | |
|---|---|---|---|
| 4,803,545 A | 2/1989 | Birkle | |
| 5,350,713 A | 9/1994 | Liang | |
| 5,572,069 A * | 11/1996 | Schneider | 257/690 |
| 5,834,842 A | 11/1998 | Majumdar et al. | |
| 6,303,978 B1 * | 10/2001 | Daniels et al. | 257/642 |
| 6,351,034 B1 | 2/2002 | Farnworth et al. | |
| 6,396,127 B1 | 5/2002 | Munoz et al. | |
| 6,587,344 B1 | 7/2003 | Ross | |
| 6,608,373 B2 | 8/2003 | Wu et al. | |
| 6,638,789 B1 * | 10/2003 | Glenn et al. | 438/109 |
| 6,765,652 B1 * | 7/2004 | Jiang | 355/405 |
| 6,767,757 B2 * | 7/2004 | Kang et al. | 438/48 |
| 6,780,746 B2 * | 8/2004 | Kinsman et al. | 438/612 |
| 2002/0140093 A1 * | 10/2002 | Yamazaki et al. | 257/734 |
| 2002/0180059 A1 * | 12/2002 | Shibata | 257/777 |
| 2003/0001107 A1 * | 1/2003 | Kroon et al. | 250/492.2 |
| 2004/0130013 A1 * | 7/2004 | Sunohara et al. | 257/678 |
| 2004/0195701 A1 * | 10/2004 | Attarwala | 257/783 |
| 2005/0148160 A1 * | 7/2005 | Farnworth et al. | 438/462 |

\* cited by examiner

*Primary Examiner* — Hsien-ming Lee
(74) *Attorney, Agent, or Firm* — Barbara B. Courtney

(57) ABSTRACT

A Conductive Epoxy Coating ("CEC") process is provided for assembling semiconductor devices. The CEC process includes application of a conductive epoxy coating prior to wafer dicing and instead of dispensing epoxy/solder when performing die bonding. The CEC process generally begins with a silicon wafer. Processing of the silicon wafer includes coupling a conductive epoxy layer to a first side of the semiconductor wafer to form a coated wafer. The process cures the coated wafer and forms die from the coated wafer. The process further couples an exposed side of the conductive epoxy layer of the die to a lead frame to form a semiconductor device, and cures the semiconductor device.

12 Claims, 7 Drawing Sheets

SEMICONDUCTOR DEVICE ASSEMBLY PROCESS

RELATED APPLICATION

This application claims the benefit of U.S. patent application Ser. No. 60/540,185, filed on Jan. 29, 2004.

TECHNICAL FIELD

The present invention relates generally to the field of integrated circuit ("IC") device packaging technology and, more particularly, to packaging that includes application of conductive epoxy coating instead of epoxy/solder dispensing during die bonding.

BACKGROUND

Integrated circuit ("IC") die or "die" are typically mounted in or on a package in order to form a semiconductor device, also referred to as a "semiconductor device package", a "semiconductor chip package", a "semiconductor package" or an "IC device package". Mounting of an IC die to a package facilitates subsequent attachment of the resulting semiconductor device to a printed circuit board ("PCB") or other component of an electronic assembly. There are three typical processes available for semiconductor device assembly. Generally, these processes are referred to as the eutectic process, the epoxy process, and the solder process. Regardless of which process is used, the process results in mechanical and electrical connections between a semiconductor die and a corresponding lead frame of the semiconductor package.

FIG. 5 is a side view of a typical generic semiconductor device package 5 under the prior art. The semiconductor package 5 includes a bottom plate portion 6, referred to as "pads" on the lead frame, and terminals 2a and 2b. A semiconductor die 1 is placed on the bottom plate portion 6, and secured to the bottom plate portion 6, typically using a solder material or Gold-Silicon intermetallic bond produced when die bonding with high temperature (approximately 375 degrees Celsius). The semiconductor die 1 has a metalized region 7a and 7b (typically aluminum) that defines a connection area for a top surface of the semiconductor die 1. The metalized region 7a and 7b of the die is electrically connected to terminals 2a and 2b using one or more gold/copper wires 4. The wire 4 is ultrasonically bonded first to the metalized region 7a and then bonded 8a and 8b to the terminal 2a.

The eutectic semiconductor assembly process generally begins with a silicon wafer having gold plating on one side, and continues with the following steps in the following order: dicing; die bonding; wire bonding; molding; strip marking; plating trimming and forming; and testing and taping. The eutectic process requires that the step of plating gold on one side of the wafer be performed in the wafer fabricating house (unless the assembly site has this process capability as well as wafer thinning capability and wafer probe test capability). This gold plating step is an extra step in the assembly process when compared to other typical semiconductor assembly processes.

The die bonding of the eutectic process is required to be performed at a high temperature of approximately 375 degrees Celsius so as to form an adequate bond between the gold plating the bottom plate portion 6. A problem can arise when performing the die bonding that relates to the strength of the bond between the gold plating and the silicon material of the die. Die shear testing has shown the absence of silicon or poor silicon residue on the lead frame bonded pad after shearing the die 1 from the bottom plate portion 6, indicating a poor bond between the gold plating and the silicon. FIG. 6A shows a lead frame bonded pad 6 of a semiconductor package with no/poor silicon residue 9a remaining after pushing away the semiconductor die 1 (i.e., shear test), under the prior art. By comparison, FIG. 6B shows a lead frame bonded pad 6 of a semiconductor package with normal silicon residue 9b remaining after pushing away the semiconductor die 1, under the prior art.

The epoxy/solder semiconductor assembly processes generally begin with a silicon wafer processed as follows: dicing; die bonding to include dispensing epoxy/solder; curing; wire bonding; molding; strip marking plating; trimming and forming; and testing and taping. While the epoxy and solder processes are suitable for big die, it is difficult to solder bond die smaller than approximately 0.3 mm (millimeters) by 0.3 mm. For small die, overflow and rotation are the major problems when dispensing epoxy or solder. FIG. 7A shows the overflow of excess epoxy/solder 3 around a small semiconductor die 1, under the prior art. The semiconductor die 1 is electrically connected to a terminal using a wire 4 bonded 8 to the terminal. There is so much excess epoxy/solder 3 on the semiconductor die 1 that the epoxy/solder surface consumes more than half of the die height surface and leaves a large amount of epoxy/solder 3 in place around the semiconductor die 1. FIG. 7B shows a normal amount of epoxy/solder 3 around a small semiconductor die 1, under the prior art. Further, epoxy/solder 3 sometimes does not dispense smoothly resulting in uneven and/or inconsistently dispensed dots on the lead frame pads; this can cause immediate or long-term electrical failure of the semiconductor device. Additionally, both epoxy and solder processes require the use of a dispensing head for the die bonding machine.

BRIEF DESCRIPTION OF THE FIGURES

In the drawings, the same reference numbers identify identical or substantially similar elements or acts.

DETAILED DESCRIPTION

A Conductive Epoxy Coating ("CEC") process is provided for use in assembling semiconductor devices. The Conductive Epoxy Coating Process, also referred to as the "Wafer Backside Coating ("WBC") process or "WBC semiconductor assembly process", includes application of a conductive epoxy coating to the wafer prior to wafer dicing and instead of dispensing epoxy/solder when performing die bonding. Beginning with a silicon wafer, the CEC process applies a conductive epoxy layer to a first side of the semiconductor wafer to form a coated wafer. The coated wafer is cured, and die are cut from the coated wafer. The CEC process couples an exposed side of the conductive epoxy layer of the die to a lead frame to form a semiconductor device, and cures the semiconductor device. Assembly of the semiconductor device continues with wire bonding, molding, strip marking plating, trimming and forming, and testing and taping of the semiconductor device. The CEC process simplifies the semiconductor assembly process while increasing process efficiency because it does not require a wafer having gold plating applied to one side like the eutectic process, and has no die size limitations like the epoxy/solder processes.

The following description provides specific details for a thorough understanding of, and enabling description for, embodiments of a CEC process for assembling semiconductor devices. However, one skilled in the art will understand that the CEC process may be practiced without these details. In other instances, well-known structures and functions have not been shown or described in detail to avoid unnecessarily obscuring the description of the embodiments of the CEC process.

Figure 1:
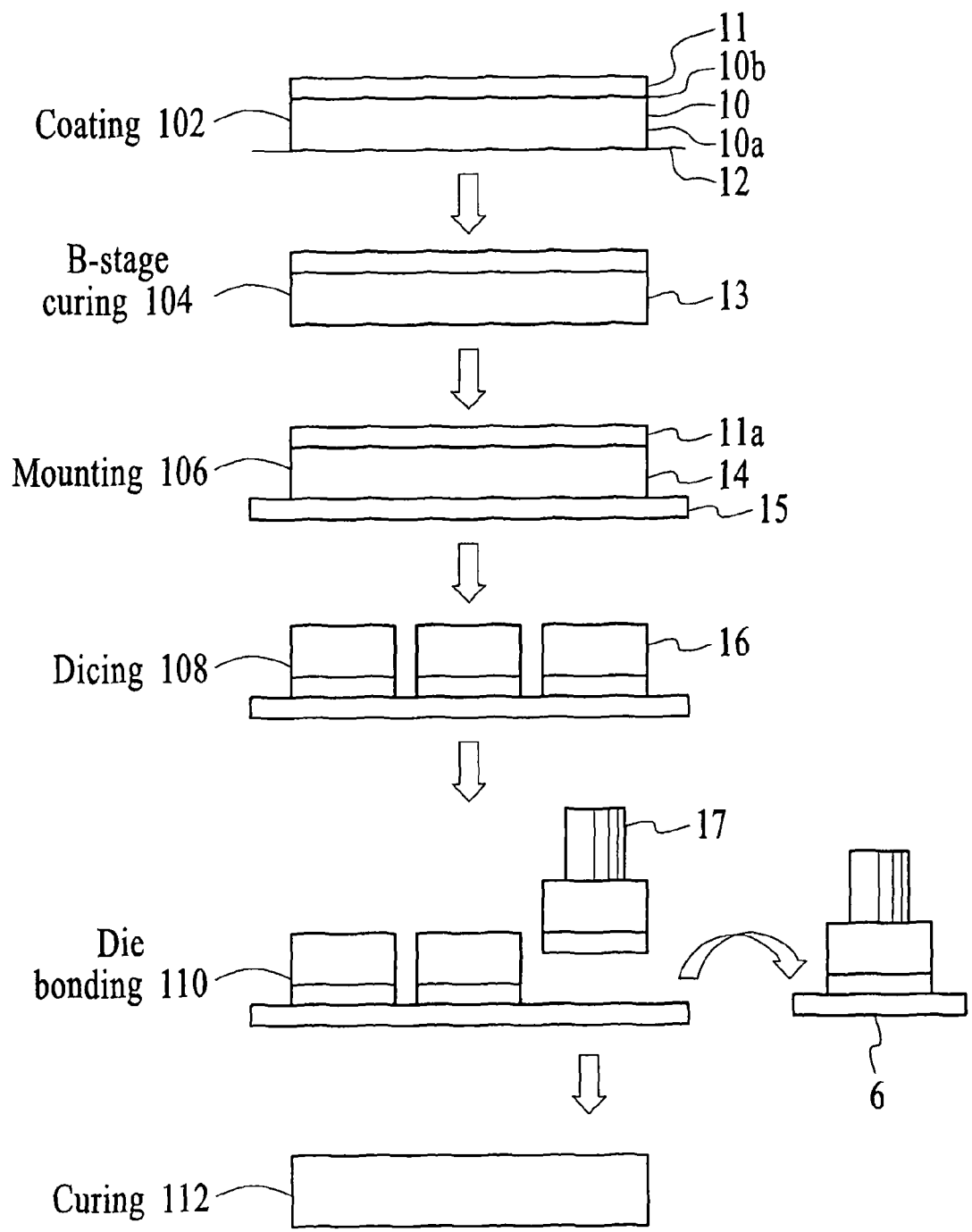
FIG. 1 is a block diagram of a Conductive Epoxy Coating ("CEC") process, under an embodiment.

FIG. 1 is a block diagram 100 of a CEC process 100, under an embodiment. The coating 102 uses a coating machine and a stencil to achieve a proper thickness of the epoxy layer. The coating 102 begins with cleaning of a work area of the coating machine. Conductive epoxy is applied to the work area of the coating machine using, for example, a squeegee; the application of conductive epoxy to the work area is performed in accordance with the operation guide of the coating machine. The conductive epoxy can be metal filled conductive material, for example, but is not so limited. The pallet 12 of the coating machine conveyer belt is cleaned with a compressed air gun, for example, and the semiconductor wafer 10 is positioned upside down on the pallet 12. This positioning places the top surface 10a of the wafer 10 in contact with the top surface of the pallet 12, and has the bottom surface 10b of the wafer 10 positioned in an upward-facing direction in preparation for the application of the coating. Vacuum is applied to the top surface 10a of the wafer upon placement of the upside down wafer 10 on the pallet 12 in order to secure the wafer 10 to the pallet 12.

The coating 102 continues with activation of the coating machine and the application of a conductive epoxy layer 11 to the bottom surface 10b of the wafer 10. Application of the conductive epoxy layer 11 may include use of a stencil and/or wire mesh plate but is not so limited. Also, a coating force approximately in the range of 0.2 to 2 newtons (N) may be used during the application, as one example. The coated wafer 13 is unloaded from the pallet 12 into a cassette for curing 104, being careful not to disturb the coated epoxy layer 11.

B-stage curing 104 of the coated wafer 13 follows coating 102 under an embodiment. The cassette including the coated wafer 13 is placed in a curing box. The curing box effects curing of the coated wafer 13 in an atmosphere that includes nitrogen and has curing conditions set/controlled in accordance with information of at least one of the epoxy type, the material characteristics, and supplier. As an example, the B-stage curing 104 may be performed at temperatures approximately in a range of 100 to 150 degrees Celsius but is not limited to temperatures in this range. When numerous coated wafers are cured, a plane or barrier that includes copper or other suitable alternative materials is placed between (not in contact with) any two pieces of the wafer in order to prevent volatile emissions from the conductive epoxy of one wafer from damaging the top surface 10a of another wafer 10.

Mounting 106 and dicing 108 follow curing 104 under an embodiment. Mounting 106 includes mounting the cured wafer 14 on a tape 15 or other suitable substrate/device. Dicing 108 of the mounted wafer includes sawing the cured wafer 14 to form numerous individual semiconductor die 16. The parameters of the sawing are optimized in accordance with the specifications of the coated wafer 14.

Die bonding 110 follows dicing 108 under an embodiment. The die bonding head 17 picks up the die 16 and places the die 16 onto the lead frame bonding pad 6 as appropriate. The die bonding 110 commences at such time as the temperature reaches the setting point.

Curing 112 follows die bonding 110 and precedes wire bonding under an embodiment. The semiconductor die 16/lead frame bonding pad 6 combination is placed in the curing box. The curing box cures the die 16/pad 6 combination in order to stably fasten the die 16 to the lead frame pad 6. The curing box effects the curing 112 in a controlled atmosphere that includes nitrogen, or is nitrogen filled, and is regulated at a temperature of approximately 175 degrees Celsius, but the embodiment is not so limited. As an example, the curing 112 may be performed at temperatures approximately in a range of 150 to 200 degrees Celsius but is not limited to temperatures in this range. The curing time is approximately two (2) hours including one-half hour during which the temperature is brought up to the desired curing temperature in a controlled manner. Alternative embodiments can use different combinations of temperature and time to effect curing 112.

Following curing 112, the CEC process of an embodiment performs other processing on the cured die as appropriate to the assembly process. As an example, the CEC process of an embodiment performs wire bonding 114 to the die 16, molding 116, strip marking plating 118, trimming and forming 120, and testing and taping 122.

Figure 2:
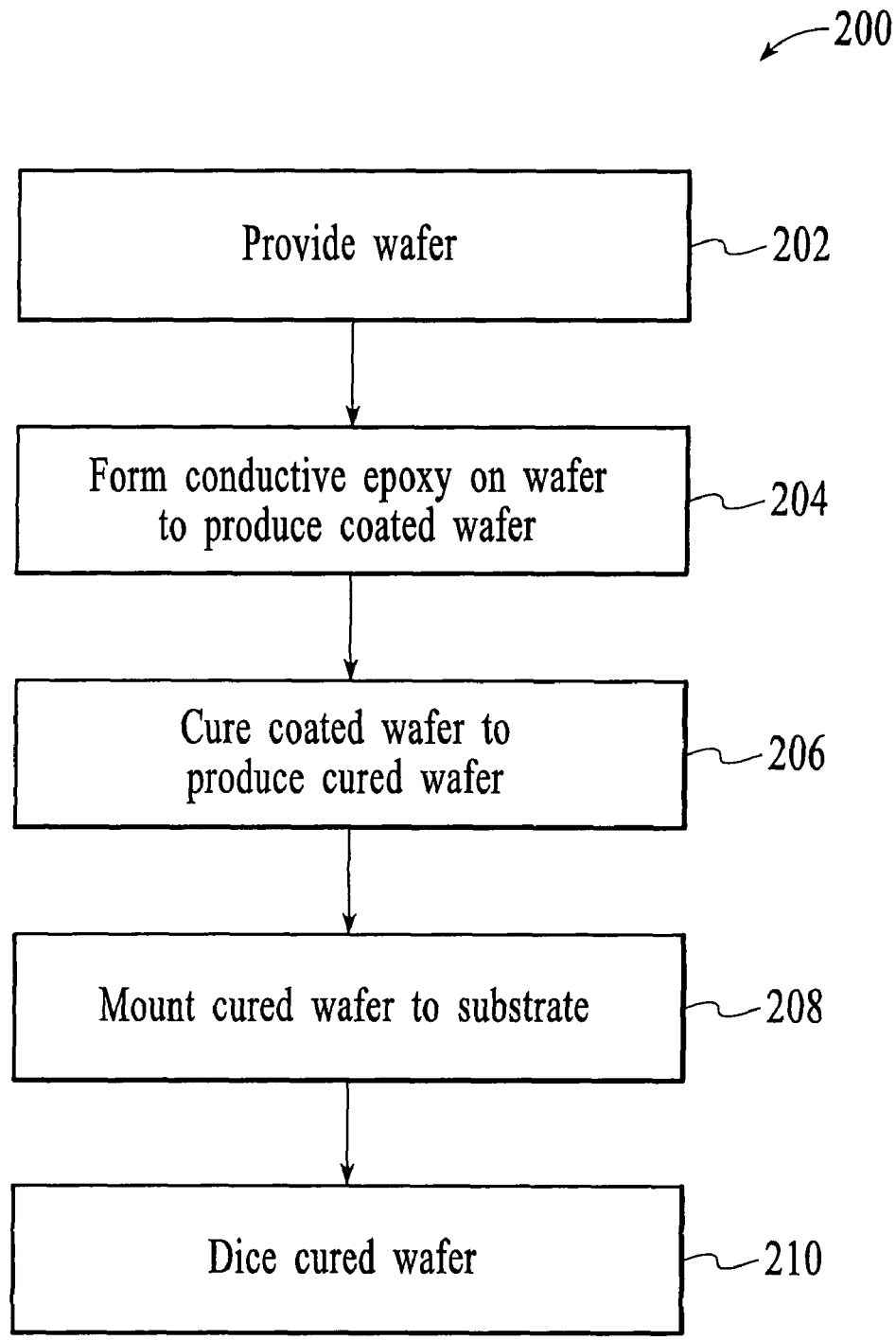
FIG. 2 is a flow diagram of the CEC process, under an embodiment.

As one example of the CEC process described above, FIG. 2 is a flow diagram 200 of the CEC process, under an embodiment. The CEC process 200 generally begins upon receipt of at least one semiconductor wafer, at block 202. The CEC process forms a coated wafer by applying or forming a conductive epoxy layer on a first side of the semiconductor wafer, at block 204. The CEC process forms a cured wafer through the application of a curing process to the coated wafer, at block 206. Following curing of the coated wafer, the CEC process mounts or secures an exposed side of the conductive epoxy layer of the cured wafer to a substrate, at block 208. The exposed side of the conductive epoxy layer is a side opposite a second side of the semiconductor wafer, but is not limited to this side. A die having the conductive epoxy layer is formed from the cured wafer using a dicing or cutting process, at block 210.

The CEC process of an embodiment may further process the die having the conductive epoxy layer by removing a die from the substrate, and coupling an exposed side of the conductive epoxy layer of the die to a lead frame. This process of mating the die to the lead frame forms a semiconductor device, and the semiconductor device is subsequently cured in order to form a stable bond between the die and the lead frame. Curing of the semiconductor device of an embodiment includes placing the semiconductor device in an environment that includes a nitrogen-rich atmosphere. A temperature of the environment is controlled during the curing so as to incrementally raise the temperature to a curing temperature during a first time period and to maintain the environment at the curing temperature for a second time period. As one example of a semiconductor curing process, the curing temperature is approximately 175 degrees Celsius, the first time period is approximately thirty (30) minutes, and the second time period is approximately ninety (90) minutes, but other combinations of temperature and periods of time may be used as appropriate to the conductive epoxy layer.

Following curing of the semiconductor device the CEC process of an embodiment performs other processing on the cured device as appropriate to the assembly process. As an example, the CEC process of an embodiment performs wire bonding to the die, molding, strip marking plating, trimming and forming, and testing and taping to name a few.

Figure 3:
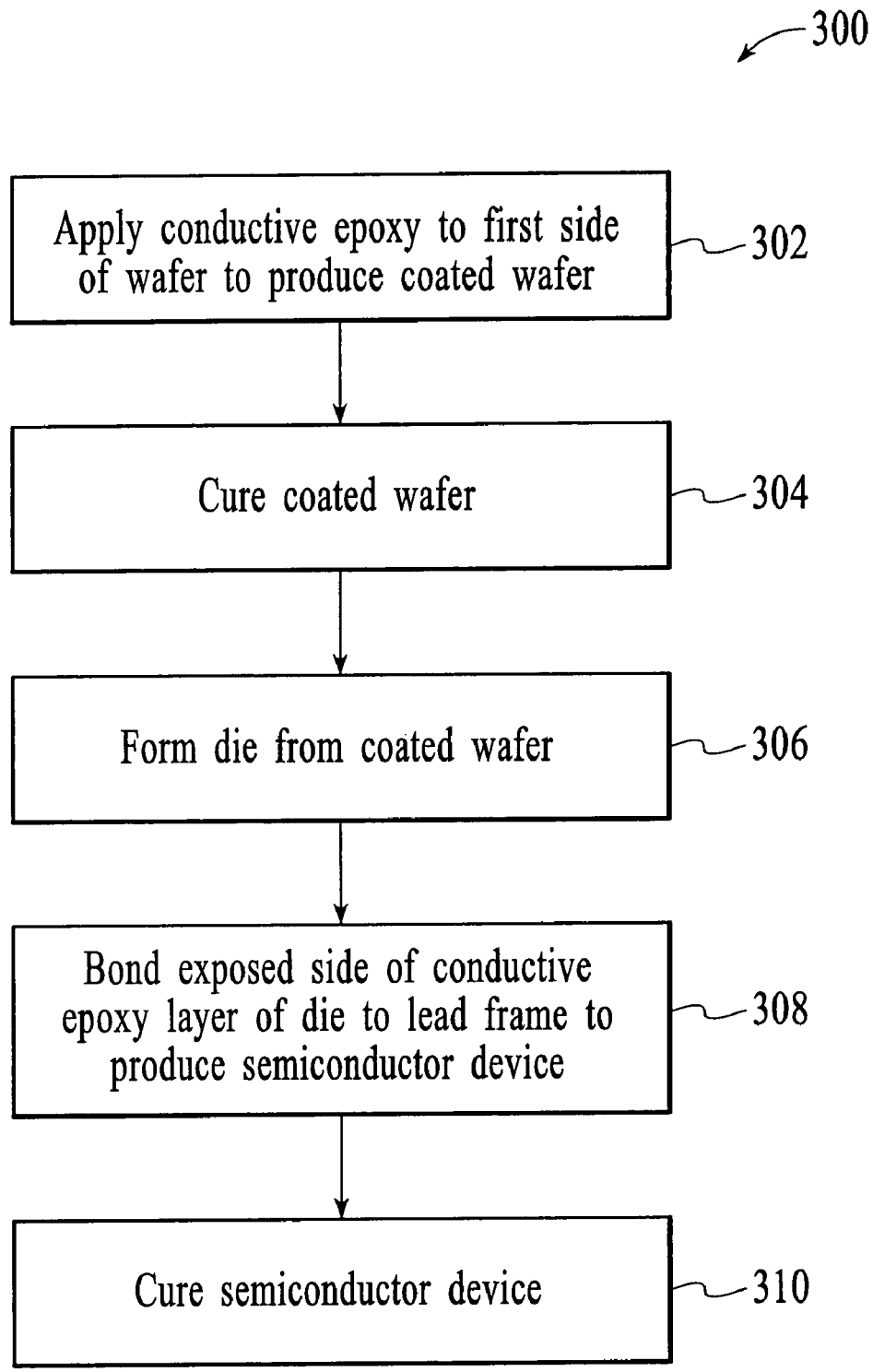
FIG. 3 is another flow diagram of the CEC process, under an embodiment.

FIG. 3 is another flow diagram 300 of the CEC process, under an embodiment. The CEC process 300 generally begins by applying or coupling a conductive epoxy layer to a first side of a semiconductor wafer, thus forming a coated wafer, at block 302. The CEC process cures the coated wafer, at block 304, and forms one or more die from the coated wafer, at block 306. The formation of dice having the conductive epoxy layer includes use of a dicing or cutting process, but is not so limited.

Following dicing, the CEC process bonds or couples a die to a lead frame, at block 308, to form individual semiconductor devices from individual die. The process of mating the die to the lead frame includes coupling an exposed side of the conductive epoxy layer of the die to a lead frame, but may not be so limited. The semiconductor device is subsequently cured in order to form a stable bond between the die and the lead frame, at block 310.

As described above, curing of the semiconductor device of an embodiment includes placing the semiconductor device in an environment that includes a nitrogen-rich atmosphere. A temperature of the environment is controlled during the curing so as to incrementally raise the temperature to a curing temperature during a first time period and to maintain the environment at the curing temperature for a second time period. As one example of a semiconductor curing process, the curing temperature is approximately 175 degrees Celsius, the first time period is approximately thirty (30) minutes, and the second time period is approximately ninety (90) minutes, but other combinations of temperature and periods of time may be used as appropriate to the conductive epoxy layer.

Following curing of the semiconductor device the CEC process of an embodiment performs other processing on the cured device as appropriate to the assembly process. As an example, the CEC process of an embodiment performs wire bonding to the die, molding, strip marking plating, trimming and forming, and testing and taping to name a few.

Figure 4:
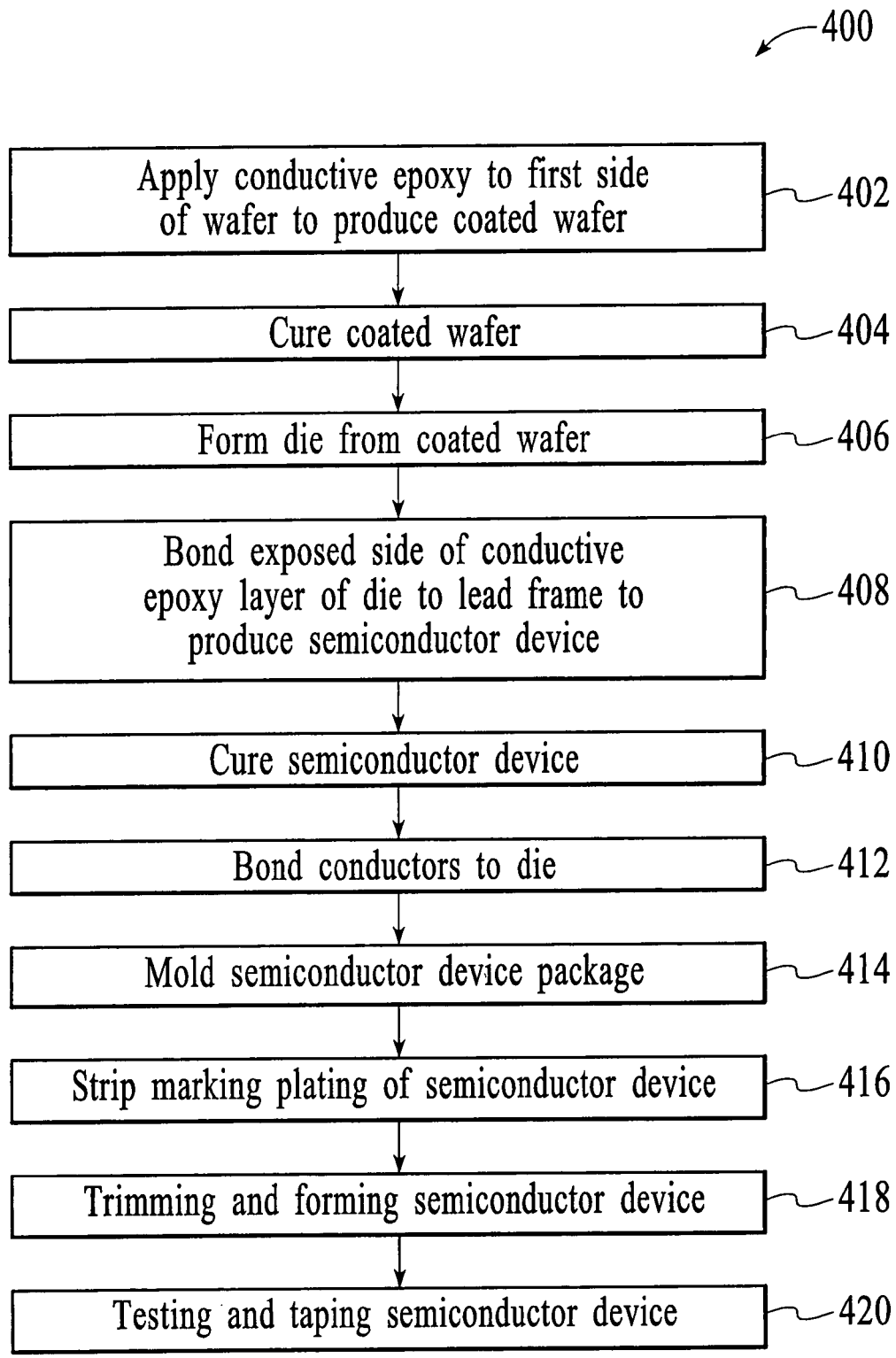
FIG. 4 is a flow diagram of semiconductor assembly that includes the CEC process, under an embodiment.
Figure 5:
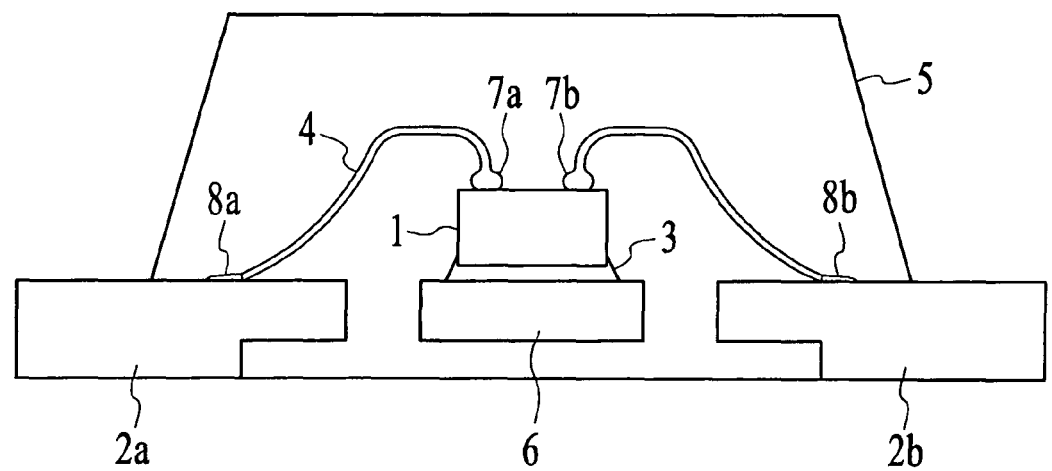
FIG. 5 is a side view of a typical generic semiconductor package, under the prior art.
Figure 6A:
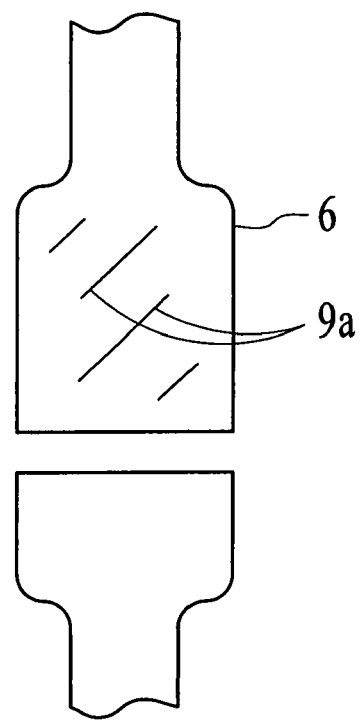
FIG. 6A shows a lead frame pad of a semiconductor package with poor silicon residue remaining after pushing away the semiconductor die, under the prior art.
Figure 6B:
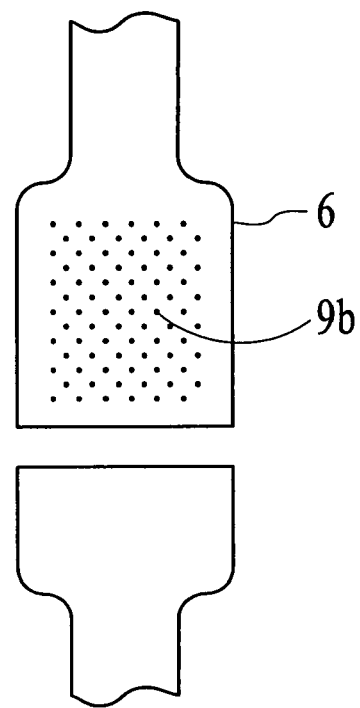
FIG. 6B shows a lead frame pad of a semiconductor package with normal silicon residue remaining after pushing away the semiconductor die, under the prior art.
Figure 7A:
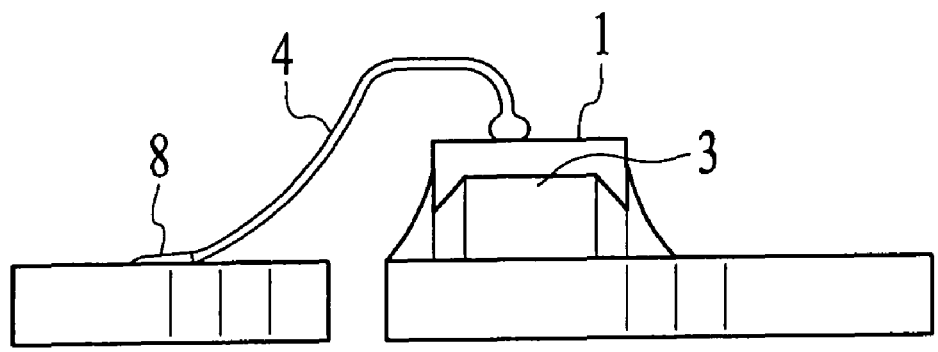
FIG. 7A shows the overflow of excess epoxy/solder around a small semiconductor die, under the prior art.
Figure 7B:
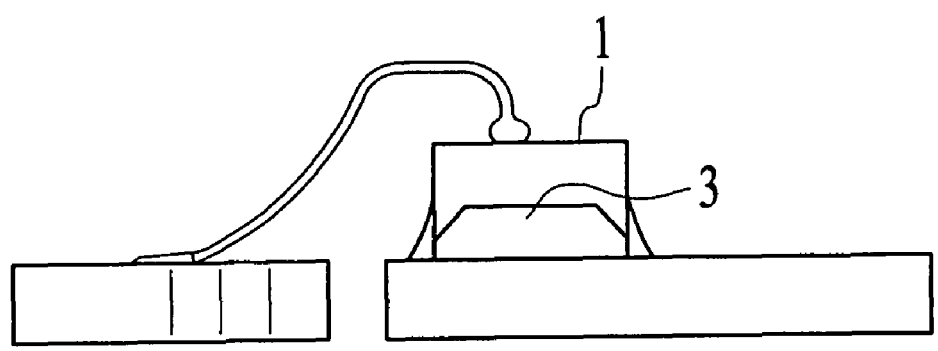
FIG. 7B shows a normal amount of epoxy/solder around a small semiconductor die, under the prior art.

FIG. 4 is a flow diagram 400 of semiconductor assembly that includes the CEC process, under an embodiment. The semiconductor assembly 400 generally begins with the application of a conductive epoxy layer to a first side of a semiconductor wafer, thus forming a coated wafer, at block 402. The assembly process cures the coated wafer, at block 404, and forms one or more die from the coated wafer via dicing, at block 406, but is not so limited. Following dicing, the assembly process bonds or couples a die to a lead frame, at block 408, to form individual semiconductor devices from individual die. The process of mating the die to the lead frame includes coupling an exposed side of the conductive epoxy layer of the die to a lead frame. The semiconductor device is subsequently cured as described above in order to form a stable bond between the die and the lead frame, at block 410.

The assembly process next bonds conductors or wires to the die, at block 412, and molds or forms a device package on/around the semiconductor device, at block 414. The assembly process also further includes strip marking plating, at block 416, trimming and forming, at block 418, and testing and taping, at block 420.

Aspects of the CEC process and the devices made using the CEC process described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the CEC process and the devices made using the CEC process include: microcontrollers with memory (such as electronically erasable programmable read only memory (EEPROM)), embedded microprocessors, firmware, software, etc. Furthermore, aspects of the CEC process and the devices made using the CEC process may be embodied in microprocessors having software-based circuit emulation, discrete logic (sequential and combinatorial), custom devices, fuzzy (neural) logic, quantum devices, and hybrids of any of the above device types. Of course any underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various processes and/or devices disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described processes and/or devices may be processed by a processing entity (e.g., one or more processors) within the computer system in conjunction with execution of one or more other computer programs including, without limitation, netlist generation programs, place and route programs and the like, to generate a representation or image of a physical manifestation of such processes and/or devices. Such representation or image may thereafter be used in device fabrication.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the CEC process and the devices made using the CEC process are not intended to be exhaustive or to limit the processes and/or devices to the precise form disclosed. While specific embodiments of, and examples for, the CEC process and the devices made using the CEC process are described herein for illustrative purposes, various equivalent modifications are possible within the scope of these processes and/or devices, as those skilled in the relevant art will recognize. The teachings of the CEC process and the devices made using the CEC process provided herein can be applied to other processing systems and methods, not only for the systems and methods described above.

The elements and acts of the various embodiments described above can be combined to provide further embodiments. These and other changes can be made to the CEC process and the devices made using the CEC process and methods in light of the above detailed description.

In general, in the following claims, the terms used should not be construed to limit the CEC process and the devices made using the CEC process to the specific embodiments disclosed in the specification and the claims, but should be construed to include all processing systems that operate under the claims. Accordingly, the CEC process and the devices made using the CEC process are not limited by the disclosure, but instead the scope of these processes and/or devices is to be determined entirely by the claims.

While certain aspects of the CEC process and the devices made using the CEC process are presented below in certain claim forms, the inventors contemplate the various aspects of these processes and/or devices in any number of claim forms. Accordingly, the inventors reserve the right to add additional claims after filing the application to pursue such additional claim forms for other aspects of the CEC process and the devices made using the CEC process.

What is claimed is:

1. A method for making a semiconductor device, comprising:
   providing at least one semiconductor wafer;
   forming a conductive epoxy layer on a substantial portion of a first side of the semiconductor wafer to form a coated wafer prior to dicing the semiconductor wafer, wherein the conductive epoxy layer is contained to only the first side of the semiconductor wafer, wherein the conductive epoxy comprises metal filled conductive material;
   following the forming of the conductive epoxy layer on the substantial portion of the first side of the semiconductor wafer, curing the coated wafer to form a cured wafer;
   mounting the cured wafer to a substrate; and
   following the curing, forming coated die having the conductive epoxy layer on the substantial portion of the first side by cutting the cured wafer attached to the substrate.

2. The method of claim 1, further comprising:
   coupling an exposed side of the conductive epoxy layer of the coated die to a lead frame to form the semiconductor device, the exposed side of the conductive epoxy layer of the coated die corresponding to the exposed side of the conductive epoxy layer of the cured wafer; and
   curing the semiconductor device.

3. The method of claim 2, further comprising wire bonding at least one conductor to at least one area of an exposed side of the coated die, the exposed side of the coated die corresponding to the second side of semiconductor wafer.

4. The method of claim 2, wherein curing the semiconductor device further comprises:
   placing the semiconductor device in an environment that includes a nitrogen-rich atmosphere; and
   controlling a temperature of the environment by incrementally raising the temperature to a curing temperature during a first time period and maintaining the environment at the curing temperature for a second time period.

5. The method of claim 4, wherein the curing temperature is approximately 175 degrees Celsius, the first time period is approximately thirty (30) minutes, and the second time period is approximately ninety (90) minutes.

6. A method comprising:
   applying a conductive epoxy layer to a substantial portion of a first side of a semiconductor wafer to form a coated wafer, wherein the conductive epoxy layer is contained to only the first side of the semiconductor wafer prior to dicing the semiconductor wafer, wherein the conductive epoxy comprises metal filled conductive material;
   following the applying of the conductive epoxy layer to the substantial portion of the first side of the semiconductor wafer, curing the coated wafer;
   mounting the cured wafer to a substrate; and
   following the curing, forming coated die from the coated wafer, the coated die having the conductive epoxy layer on the substantial portion of the first side;
   coupling an exposed side of the conductive epoxy layer of the coated die to a lead frame to form a semiconductor device;
   wire bonding at least one conductor to at least one area of an exposed side of the die, wherein the exposed side of the die is opposite the exposed side of the conductive epoxy layer.

7. The method of claim 6, wherein curing the semiconductor device further comprises:
   placing the semiconductor device in an environment that includes a nitrogen-rich atmosphere; and
   controlling a temperature of the environment by incrementally raising the temperature to a curing temperature during a first time period and maintaining the environment at the curing temperature for a second time period.

8. The method of claim 7, wherein the curing temperature is approximately 175 degrees Celsius, the first time period is approximately thirty (30) minutes, and the second time period is approximately ninety (90) minutes.

9. A semiconductor device comprising a coated die having a conductive epoxy layer on a substantial portion of a first side, and a lead frame, the semiconductor device formed by:
   forming the conductive epoxy layer on the substantial portion of the first side of the semiconductor wafer to form a coated wafer prior to dicing the semiconductor wafer, wherein the conductive epoxy layer is contained to only the first side of the semiconductor wafer, wherein the conductive epoxy comprises metal filled conductive material;

following the forming of the conductive epoxy layer on the substantial portion of the first side of the semiconductor wafer, curing the coated wafer to form a cured wafer;

mounting the cured wafer to a substrate;

following the curing, cutting the cured wafer to form at least one coated die having the conductive epoxy layer on the substantial portion of the first side; and coupling the exposed side of the conductive epoxy layer of the coated die to the lead frame to form the semiconductor device.

10. The device of claim 9, wherein the semiconductor device is further formed by:

curing the semiconductor device; and wire bonding at least one conductor to at least one area of an exposed side of the die as coupled to the lead frame, the exposed side of the die corresponding to the second side of semiconductor wafer.

11. The device of claim 10, wherein curing the semiconductor device further comprises:

placing the semiconductor device in an environment that includes a nitrogen-rich atmosphere; and controlling a temperature of the environment by incrementally raising the temperature to a curing temperature during a first time period and maintaining the environment at the curing temperature for a second time period.

12. The device of claim 11, wherein the curing temperature is approximately 175 degrees Celsius, the first time period is approximately thirty (30) minutes, and the second time period is approximately ninety (90) minutes.

* * * * *